(12) United States Patent
Brandenburg et al.

(10) Patent No.: US 7,473,585 B2
(45) Date of Patent: Jan. 6, 2009

(54) TECHNIQUE FOR MANUFACTURING AN OVERMOLDED ELECTRONIC ASSEMBLY

(75) Inventors: Scott D. Brandenburg, Kokomo, IN (US); David A. Laudick, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 120 days.

(21) Appl. No.: 11/150,997

(22) Filed: Jun. 13, 2005

(65) Prior Publication Data

US 2006/0281230 A1  Dec. 14, 2006

(51) Int. Cl.
*H01L 21/00* (2006.01)
(52) U.S. Cl. ............... 438/124; 438/107; 438/110; 438/118; 438/121; 438/122; 438/125; 438/126; 361/717; 361/718
(58) Field of Classification Search ............ 438/107, 438/110, 118, 121–122, 124–126; 361/717–718
See application file for complete search history.

(56) References Cited

U.S. PATENT DOCUMENTS

| | | |
|---|---|---|
| 4,679,463 A | 7/1987 | Ozaki et al. |
| 5,189,930 A | 3/1993 | Kameda |
| 5,310,388 A | 5/1994 | Okcuoglu et al. |
| 6,285,551 B1 * | 9/2001 | Brandenburg et al. ....... 361/704 |
| 6,307,749 B1 * | 10/2001 | Daanen et al. .............. 361/704 |
| 6,833,628 B2 * | 12/2004 | Brandenburg et al. ....... 257/778 |
| 6,873,040 B2 * | 3/2005 | Howard et al. ............. 257/691 |
| 2004/0148214 A1 | 7/2004 | Aziz et al. |
| 2004/0148299 A1 | 7/2004 | Teegan et al. |
| 2005/0040518 A1 * | 2/2005 | Brandenburg et al. ....... 257/712 |
| 2005/0201069 A1 * | 9/2005 | Kirigaya ..................... 361/752 |
| 2006/0292751 A1 | 12/2006 | Brandenburg et al. |

* cited by examiner

*Primary Examiner*—Michael Trinh
*Assistant Examiner*—Bac H Au
(74) *Attorney, Agent, or Firm*—Jimmy L. Funke

(57) ABSTRACT

A technique for manufacturing an electronic assembly includes a number of steps. Initially, a backplate with a cavity formed into a first side of the backplate is provided. Next, a substrate with a first side of an integrated circuit (IC) die mounted to a first side of the substrate is provided. The IC die is electrically connected to one or more of a plurality of electrically conductive traces formed on the first side of the substrate. The substrate includes a hole approximate an outer edge of the IC die. The first side of the substrate is then positioned in contact with at least a portion of the first side of the backplate. The IC die is positioned within the cavity with a second side of the IC die in thermal contact with the backplate. The substrate and at least a portion of the backplate are overmolded with an overmold material, which enters the cavity through the hold to substantially underfill the IC die and substantially fill an unoccupied portion of the cavity.

15 Claims, 5 Drawing Sheets

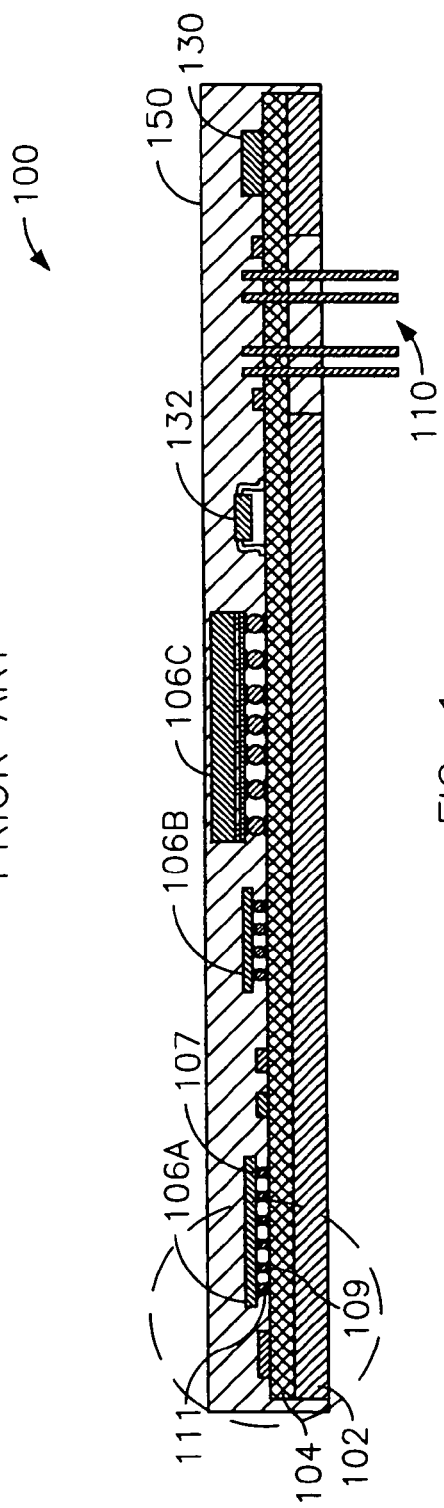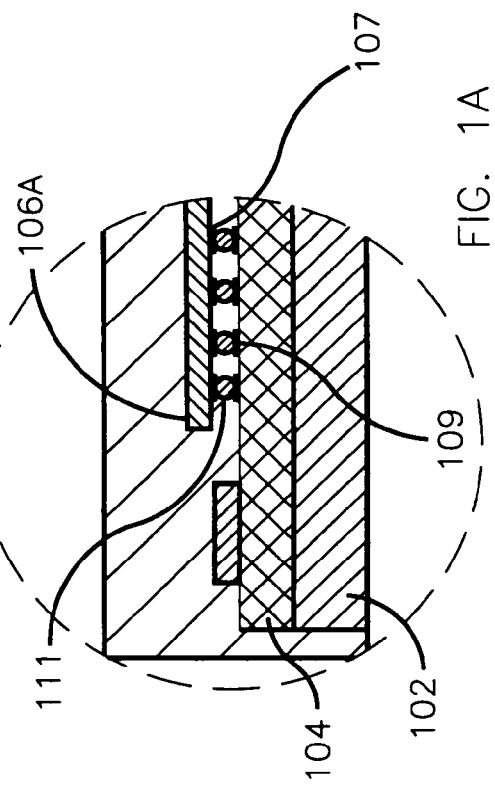

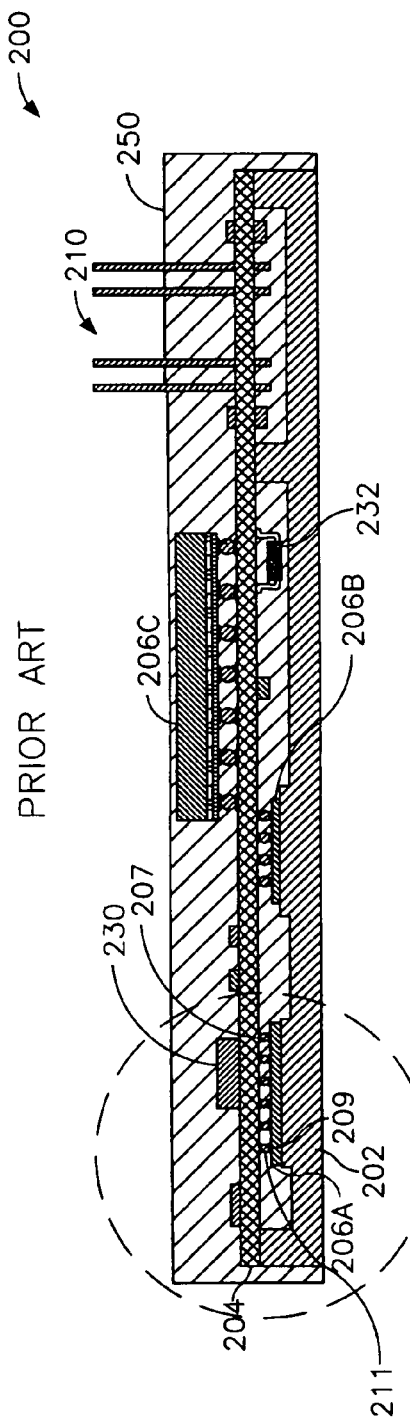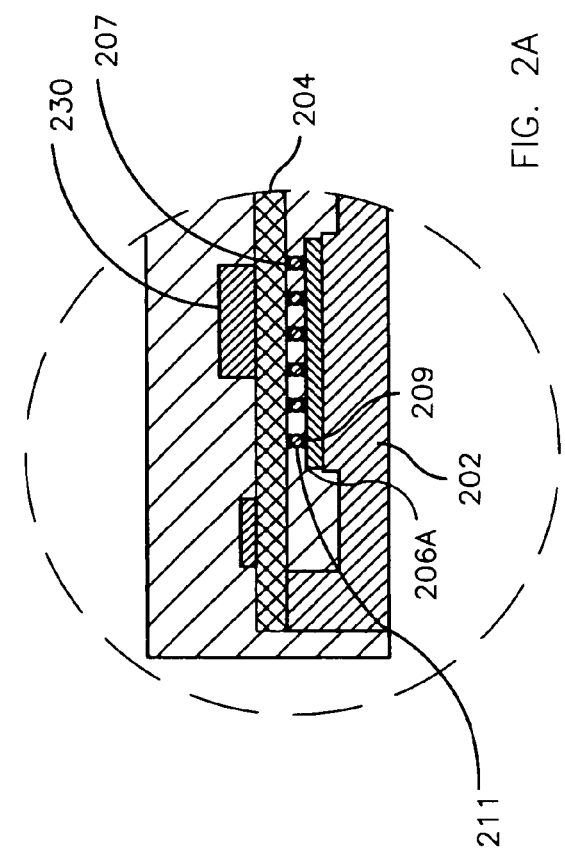
PRIOR ART
FIG. 2
FIG. 2A

TECHNIQUE FOR MANUFACTURING AN OVERMOLDED ELECTRONIC ASSEMBLY

TECHNICAL FIELD

The present invention is generally directed to an electronic assembly and, more specifically, to a technique for manufacturing an overmolded electronic assembly.

BACKGROUND OF THE INVENTION

Currently, a number of different overmolded electronic assemblies are implemented within the automotive environment. For example, with reference to FIGS. 1-1A, an overmolded electronic assembly 100 that includes a single-sided substrate 104, e.g., a printed circuit board (PCB), is depicted. As shown, the assembly 100 also includes a backplate 102, which provides rigidity for the PCB 104, during the overmolding process. A plurality of connector pins 110 are connected to conductive traces of the PCB 104, to provide electrical connection to an external device. Electrically connected to the PCB 104 is an integrated circuit (IC) die 106A, e.g., a flip-chip, an IC die 106B, e.g., a flip-chip, a ball grid array (BGA) 106C, a discrete component 132 and a plurality of surface mount components 130, e.g., resistors and capacitors, all of which are implemented to provide a desired functionality.

An overmold material 150 encloses the PCB 104 (and its associated components) and at least a portion of the backplate 102. Solder bumps 107 are utilized to electrically connect contacts 111 of the flip-chips 106A and 106B and the BGA 106C to electrically conductive traces 109, formed on a surface of the PCB 104. It should be appreciated that since only one side of the PCB 104 is populated, the assembly 100 generally requires a larger product form factor than would be required if a double-side PCB was implemented. This, in turn, results in a requirement that the PCB and the backplate have a larger area, which, in turn, leads to increased cost. Additionally, heatsinking the flip-chips 106A and 106B of the assembly 100 is generally more difficult, as the flip-chips 106A and 106B are located on the side of the PCB 104 that is opposite the backplate 102.

In order to decrease an electronic assembly size, various manufacturers have produced an electronic assembly similar to electronic assembly 200 of FIG. 2. As is shown in FIGS. 2-2A, flip-chips 206A and 206B are located on the same side of a PCB 204 that is contact with a heatsink 202. Similar to the electronic assembly 100 of FIG. 1, the flip-chips 206A and 206B and the BGA 206C include contacts 209, which are coupled to electrically conductive traces 207 (formed on the PCB 204) by solder bumps 211, during a solder reflow process. As is shown, the electronic assembly 200 includes a plurality of electronic components 230 and the BGA 206C that are coupled to electrically conductive traces formed on a second side of the PCB 204. While the assembly 200 of FIG. 2 can be produced with a reduced size, as compared to the assembly 100 of FIG. 1, the PCB 204 is not as well supported during the overmold process, as compared to the PCB 104 of the assembly 100 of FIG. 1.

Due to inadequate support of the PCB 204, various solder joints of the assembly 200 may be damaged during the overmold process, which encases the PCB 204 and a portion of the backplate 202 with an overmold material 250. As is shown, connector pins 210 extend from the second side of the PCB 204 to provide electrical connection to an external device. It should also be appreciated that the assembly 200 of FIG. 2 may also not adequately support the connector pins 210 during the overmold process and, as such, deflection of the PCB 204 may lead to potential damage to the connector pin solder joints.

What is needed is a technique for manufacturing an overmolded electronic assembly that allows for reduction in cost and size of the assembly and that readily allows for heatsinking of high-power devices of the assembly. Additionally, it would also be desirable if the technique provided for improved support of a substrate of the assembly, during an overmolding process, to reduce damage to solder joints of the assembly.

SUMMARY OF THE INVENTION

A technique for manufacturing an electronic assembly, according to one aspect of the present invention, includes a number of steps. Initially, a backplate that includes a cavity, formed into a first side of the backplate, is provided. Next, a substrate with a first side of an integrated circuit (IC) die mounted to a first side of the substrate is provided. The IC die is electrically connected to one or more of a plurality of electrically conductive traces formed on the first side of the substrate. The substrate includes a hole approximate an outer edge of the IC die. The first side of the substrate is then positioned in contact with at least a portion of the first side of the backplate. The IC die is positioned within the cavity with a second side of the IC die in thermal contact with the backplate. The substrate and at least a portion of the backplate are overmolded with an overmold material, which enters the cavity through the hole to substantially underfill the IC die and substantially fill an unoccupied portion of the cavity.

According to one aspect of the present invention, the substrate is a printed circuit board (PCB). According to another aspect of the present invention, the substrate includes an electrical connector, whose pins extend through an aperture in the backplate, to provide electrical interconnection to an external device. According to another aspect of the present invention, the IC die is a flip-chip. According to another embodiment of the present invention, the technique includes the additional step of providing an electrically non-conductive adhesive between at least a portion of the first side of the backplate and the first side of the substrate. According to this aspect, the adhesive may be an acrylic adhesive and the backplate may be made of aluminum. According to another aspect of the present invention, the technique includes the step of providing a thermal film between the second side of the IC die and the first side of the backplate. According to this aspect of the present invention, the thermal film may be an Indium film.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is a cross-sectional view of a prior art electronic assembly that implements a single-sided substrate;

FIG. 1A is an enlarged cross-sectional view of a portion of the assembly of FIG. 1;

FIG. 2 is a cross-sectional view of another prior art electronic assembly that implements a double-sided substrate;

FIG. 2A is an enlarged cross-sectional view of a portion of the assembly of FIG. 2;

DESCRIPTION OF THE PREFERRED EMBODIMENTS

According to one embodiment of the present invention, an electronic assembly, which includes a double-sided substrate, exhibits many of the advantages of an electronic assembly that implements a single-sided substrate. According to this aspect of the present invention, a substrate may be mounted to an aluminum backplate using an acrylic adhesive, e.g., Part No. VHB F-9473PC, manufactured and made commercially available by 3M. According to one aspect of the present invention, the substrate is primarily a single-sided assembly that includes certain electronic components, e.g., power integrated circuits (ICs) and surface mount filter capacitors, mounted on a backplate side of the substrate. Thus, in this manner, more of the double-sided substrate may be rigidly attached to the backplate to prevent movement during the overmolding process. The VHB adhesive tape provides a continuous bond, which distributes stresses along most of the surface of the substrate, and provides strength and durability in extreme applications. Furthermore, with flip-chips mounted on the heatsink side of the substrate, heatsinking can be readily achieved to enhance thermal conductivity of the assembly. As more of the substrate is supported during the overmolding process, solder joint stress of the assembly is generally reduced.

An assembly configured according to the present invention provides increased package density, as compared to assemblies implementing single-sided substrates, as flip-chips and other surface mount technology (SMT) devices may be mounted on a backplate side of the substrate. Thus, an assembly constructed according to the present invention utilizes less substrate materials, backplate materials and molding compound, as compared to prior art electronic assemblies implementing single-sided substrates. Furthermore, through the utilization of thermal films, such as an Indium film, flip-chip heatsinking may be optimized and manufacturing yield of the product may be increased.

Figure 3:
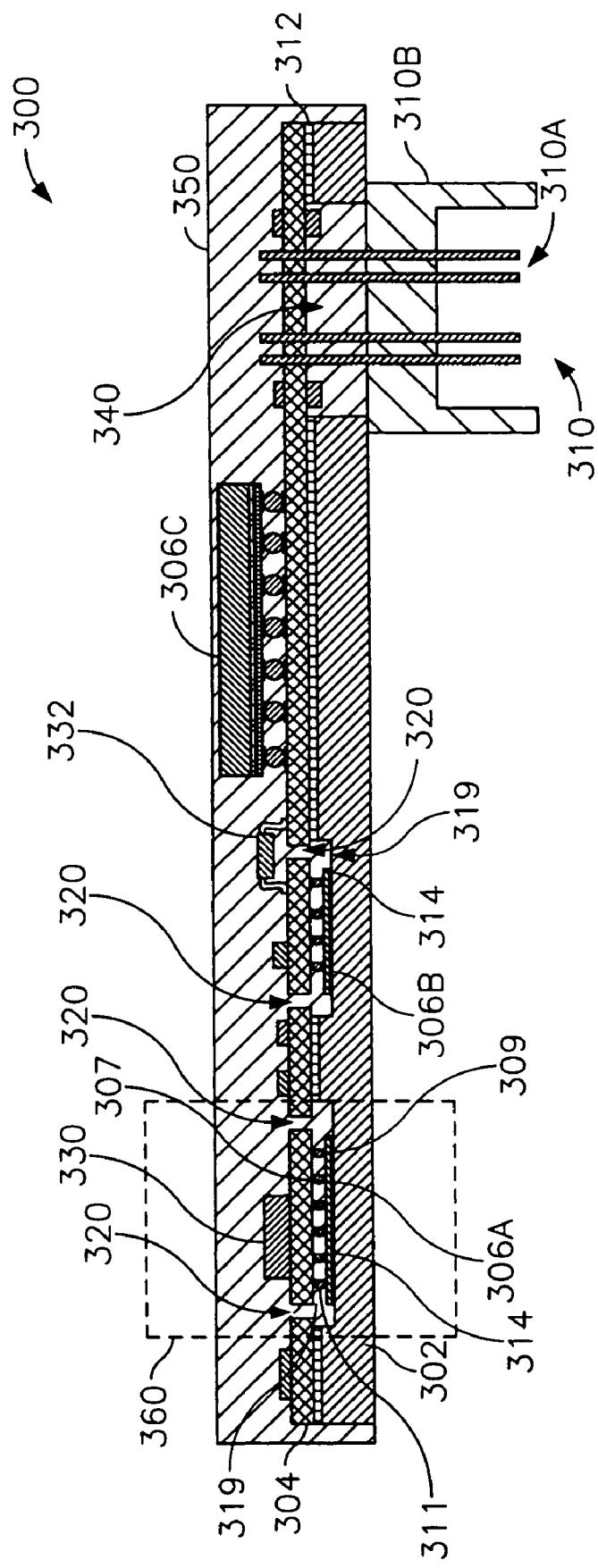
FIG. 3 is a cross-sectional view of the electronic assembly configured according to one embodiment of the present invention.

With reference to FIG. 3, an electronic assembly 300, constructed according to one embodiment of the present invention, is depicted. As is shown, the assembly 300 includes a backplate 302 and a substrate 304, e.g., a printed circuit board (PCB). The substrate 304 is connected to the backplate 302, with an adhesive 312, such as that disclosed above, manufactured and made commercially available by 3M. The backplate 302 includes a plurality of cavities 319, which receive flip-chips 306A and 306B, which are mounted to a first side of the substrate 304. A thermal film 314 is located between a second side of the flip-chips 306A and 306B and the first side of the backplate 302 in the cavity 319 area. As is shown, a ball grid array (BGA) 306C is mounted to electrically conductive traces located on a second side of the PCB 304. Additionally, a number of other electronic components 330 and 332 are mounted on the second side of the substrate 304. A connector 310 includes a plurality of pins 310 retained in a connector housing 310B. As is shown, an overmold material 350 has underfilled the flip-chips 306A and 306B and has filled the cavities 319. The filling of the cavities 319 by the material 350 is facilitated by holes 320 in the PCB 304.

Figure 3A:
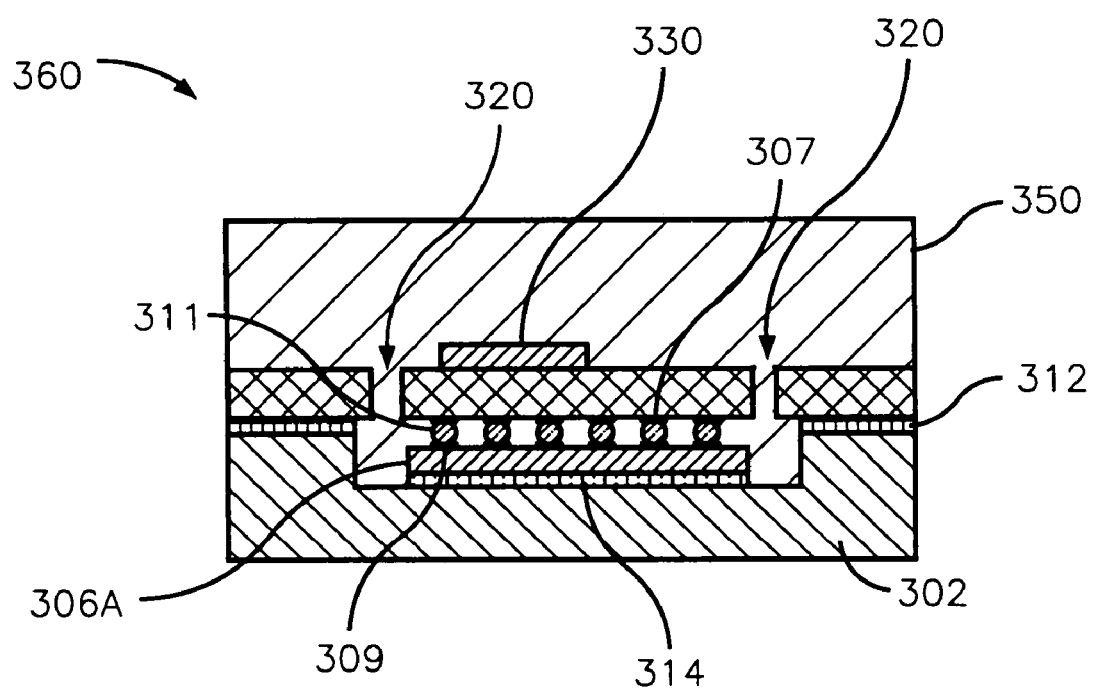
FIG. 3A is an enlarged cross-sectional view of a portion of the electronic assembly of FIG. 3.

The holes 320 facilitate entry of the overmold material 350 into the cavities 319, to allow for substantial underfill of the IC dies 306A and 306B, and filling of the cavities 319. With reference to FIG. 3A, a portion 360 of the assembly 300 is shown in an enlarged view.

Figure 4:
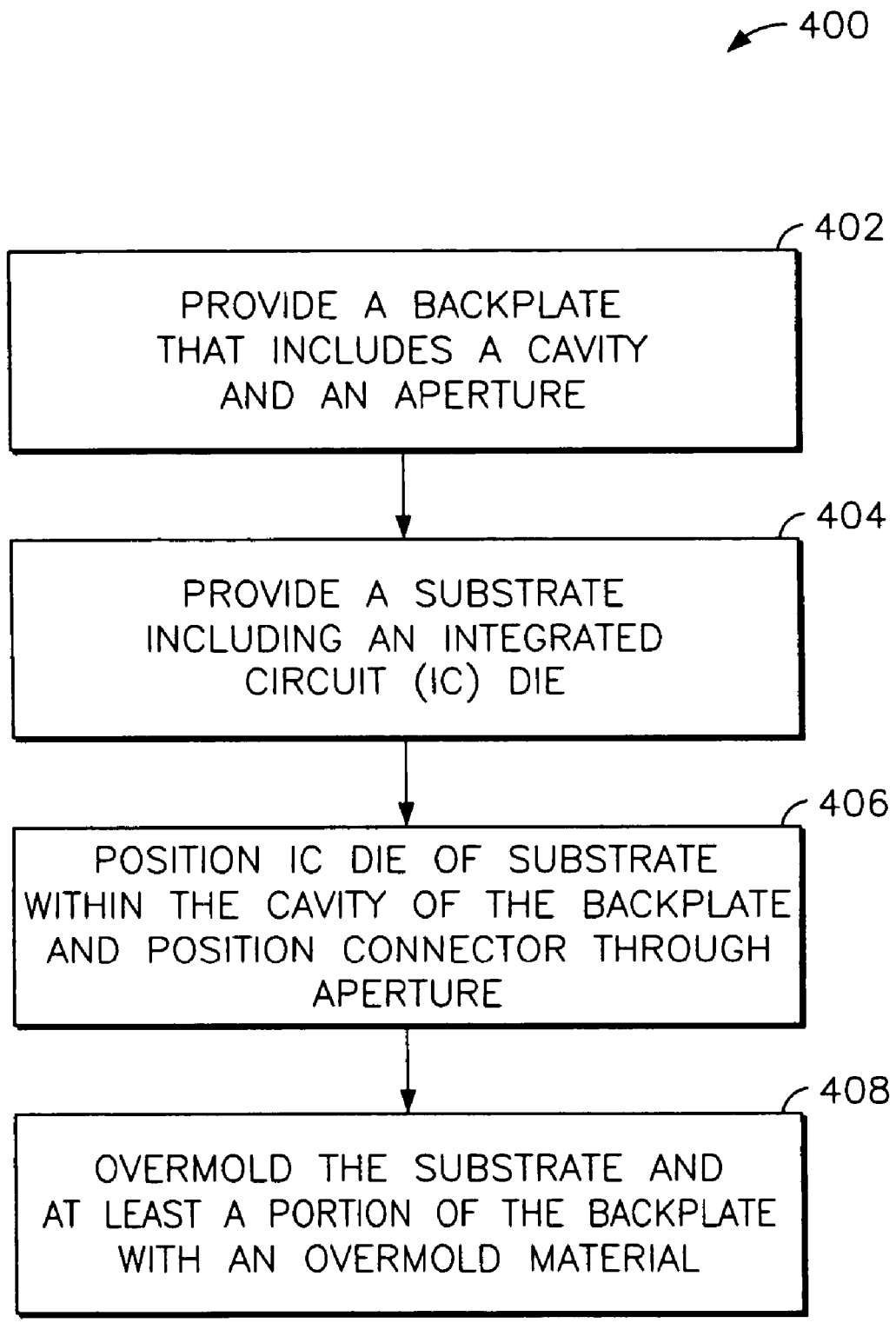
FIG. 4 is a flow chart of an exemplary process for manufacturing the assembly of FIG. 3.

With reference to FIG. 4, an exemplary routine 400 for manufacturing an overmolded electronic assembly 300 (see FIG. 3), according to the present invention, is depicted. In step 402, a backplate 302 is provided that includes a cavity 319 and an aperture 340. Next, in step 404, a substrate 304 is provided that includes integrated circuit (IC) die 306A and 306B, e.g., flip-chips. Next, in step 406, the IC die 306A and 306B are positioned in the cavity 319 of the backplate 302 and pins 310A of connector 310 are positioned through the aperture 340 and the pins 310A of the connector 310 are electrically connected to the traces of the substrate 304. Then, in step 408, the substrate 304 and at least a portion of the backplate 302 are overmolded with an overmold material 350.

Accordingly, an electronic assembly has been described herein that exhibits adequate support in the substrate connector area to prevent deflection and potential damage to connector pin solder joints. Furthermore, the electronic assembly described herein exhibits adequate support around flip-chips mounted to the PCB to prevent solder cracks and readily allow for heatsinking of the flip-chips.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for manufacturing an electronic assembly, comprising the steps of:

providing an aluminum backplate having an indentation in a first side of the backplate;

providing a double-sided substrate having a first side of an integrated circuit (IC) die mounted to a first side of the substrate and at least one electronic component mounted on a second side of the substrate, wherein the IC die is electrically connected to one or more of a plurality of electrically conductive traces formed on the first side of the substrate, and wherein the substrate includes a hole approximate an outer edge of the IC die;

positioning the first side of the substrate in contact with at least a portion of the first side of the backplate, wherein the IC die is positioned within the indentation with a second side of the IC die in thermal contact with the backplate; and overmolding the substrate and at least a portion of the backplate with an overmold material, wherein the overmold material enters the indentation through the hole to substantially underfill the IC die and substantially fill an unoccupied portion of the indentation.

2. The method of claim 1, wherein the substrate is a printed circuit board (PCB).

3. The method of claim 1, wherein the substrate includes an electrical connector whose pins extend through an aperture in the backplate to provide electrical interconnection to an external device.

4. The method of claim 1, wherein the IC die is a flip-chip.

5. The method of claim 1, further comprising the step of:

providing an electrically non-conductive adhesive between at least a portion of the first side of the backplate and the first side of the substrate.

6. The method of claim 5, wherein the adhesive is an acrylic adhesive.

7. The method of claim 1, further comprising the step of:

providing a thermal film between the second side of the IC die and the first side of the backplate.

8. The method of claim 7, wherein the thermal film is an Indium film.

9. A method for manufacturing an electronic assembly, comprising the steps of:

providing an aluminum backplate having an indentation in a first side of the backplate and an aperture;

providing a double-sided substrate with a first side of an integrated circuit (IC) die mounted to a first side of the substrate and at least one electronic component mounted on a second side of the substrate, wherein the IC die is electrically connected to one or more of a plurality of electrically conductive traces formed on the first side of the substrate, and wherein the substrate includes a hole approximate an outer edge of the IC die;

positioning the first side of the substrate in contact with at least a portion of the first side of the backplate, wherein the IC die is positioned within the indentation with a second side of the IC die in thermal contact with the backplate;

positioning pins of an electrical connector through the aperture in the backplate and electrically interconnecting the pins to one or more of the conductive traces; and overmolding the substrate and at least a portion of the backplate with an overmold material, wherein the overmold material enters the indentation through the hole to substantially underfill the IC die and substantially fill an unoccupied portion of the indentation.

10. The method of claim 9, wherein the substrate is a printed circuit board (PCB).

11. The method of claim 9, wherein the IC die is a flip-chip.

12. The method of claim 9, further comprising the step of:

providing an electrically non-conductive adhesive between at least a portion of the first side of the backplate and the first side of the substrate.

13. The method of claim 12, wherein the adhesive is an acrylic adhesive.

14. The method of claim 9, further comprising the step of:

providing a thermal film between the second side of the IC die and the first side of the backplate.

15. The method of claim 14, wherein the thermal film is an Indium film.

* * * * *